United States Patent
Shim

Patent Number: 6,078,270
Date of Patent: Jun. 20, 2000

[54] DATA TRANSMISSION METHOD OF A REMOTE CONTROLLER

[75] Inventor: Soon S. Shim, Suwon, Rep. of Korea

[73] Assignee: Samsung Electronics Co., Ltd., Kyungki-do, Rep. of Korea

[21] Appl. No.: 08/234,115

[22] Filed: Apr. 28, 1994

[30] Foreign Application Priority Data

Apr. 28, 1993 [KR] Rep. of Korea .................... 93-7191

[51] Int. Cl.[7] .................................................. G08C 19/00
[52] U.S. Cl. .................................................. 340/825.72
[58] Field of Search ........................ 340/825.72, 825.56, 340/825.69; 341/176; 348/734; 359/142, 146; 455/151.4

[56] References Cited

U.S. PATENT DOCUMENTS

| | | | |
|---|---|---|---|
| 4,412,218 | 10/1983 | Niitsu | 340/825.56 |
| 4,825,200 | 4/1989 | Evans et al. | 341/176 |
| 4,856,081 | 8/1989 | Smith | 340/825.69 |
| 4,857,898 | 8/1989 | Smith | 340/825.69 |
| 4,866,434 | 9/1989 | Keenan | 341/176 |
| 5,128,667 | 7/1992 | Enomoto et al. | 340/825.72 |
| 5,175,538 | 12/1992 | Kurita | 340/825.72 |
| 5,187,469 | 2/1993 | Evans et al. | 340/825.72 |
| 5,212,487 | 5/1993 | Lee et al. | 341/176 |
| 5,237,319 | 8/1993 | Hidaka et al. | 340/825.72 |
| 5,341,166 | 8/1994 | Garr et al. | 340/825.72 |

FOREIGN PATENT DOCUMENTS 4128907  11/1992  Germany .

*Primary Examiner*—Mark H. Rinehart
*Attorney, Agent, or Firm*—Sughrue, Mion, Zinn, Macpeak & Seas, PLLC

[57] ABSTRACT

A method of remotely controlling successive operations in at least two remotely controlled devices by actuation of a single key on a remote controller. Multiple data instructions are preassigned to select keys on the keyboard of a remote controller.

4 Claims, 2 Drawing Sheets

FIG.3
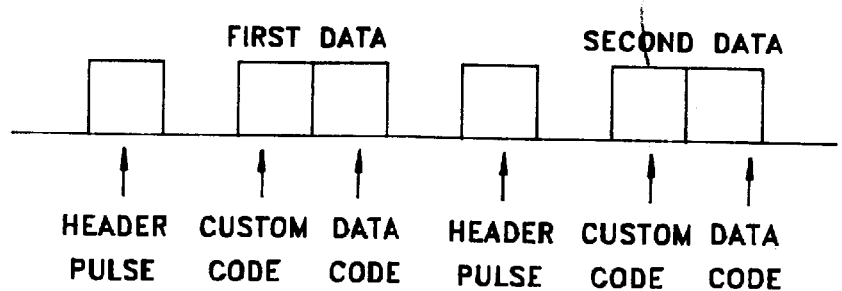
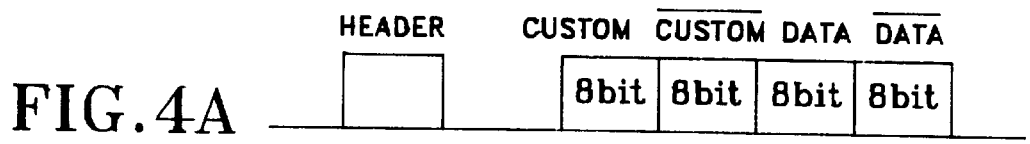
FIG.4A
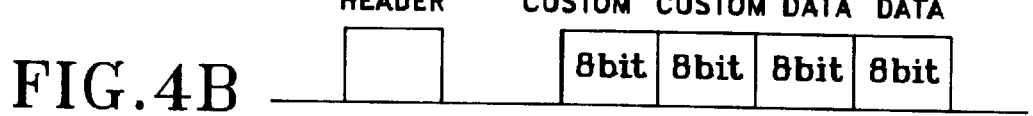
FIG.4B
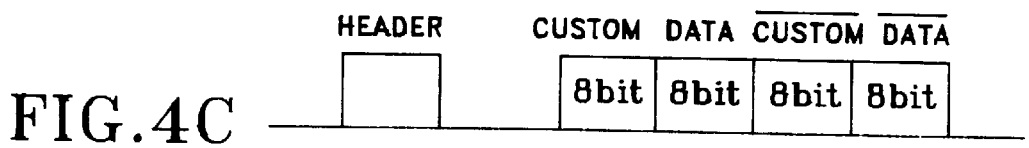
FIG.4C
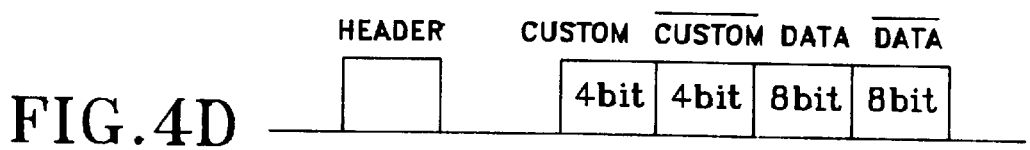
FIG.4D
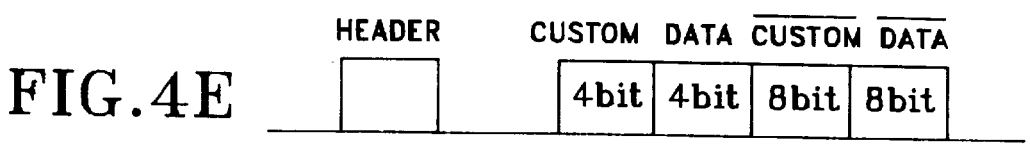
FIG.4E

ID_TRANSMISSION METHOD OF A
DATA TRANSMISSION METHOD OF A REMOTE CONTROLLER

BACKGROUND OF THE INVENTION

1. Field of the Invention

The present invention relates to a data transmission method of a remote controller, and more particularly to a data transmission method of a remote controller, wherein key manipulation of the remote controller is performed once to supply simultaneously at least two data items directing a consecutive multistage operation to predetermined apparatus, which are controllable by the remote controller.

2. Description of the Prior Art

In general, remote controllers are widely used for controlling the operation of electronic products, such as household electronic appliances, from a location distant from the product. Such a remote controller transmits an operational signal by radio transmission, and an infrared ray is utilized as the transmission medium.

A standard remote controller is equipped with a plurality of keys for controlling predetermined operations, and the user's manipulation of each key supplies only one kind of data, corresponding to the key pressed, to initiate a specific function of one appliance. According to a current trend, a plurality of appliances are controlled by a single remote controller. U.S. Pat. No. 5,128,667 discloses a remote controller which is capable of controlling a plurality of appliances.

However, the conventional multi-appliance remote controller requires consecutive manipulation of at least two keys to operate more than two appliances. For example, in the case of a remote controller which controls a video cassette recorder (VCR) and a television, in order to use the VCR, the user must turn on the power of the VCR and then set the television to channel 3 or 4 by means of a channel adjustment key or to a video mode. Accordingly, the keys of the remote controller are manipulated by pressing the keys in the order of; a power key and then a channel 3 key, or the power key and then the video/TV mode conversion key.

Also, in a remote controller generally used for a VCR and a television, the user turns on the power of the VCR, selects the television function of the remote controller, and then sets the television channel. Thus, the user manipulates the keys at least three times.

SUMMARY OF THE INVENTION

It is an object of the present invention to overcome the problems of the above prior art. Accordingly, it is an object of the present invention to provide a data transmission method of a remote controller for consecutively supplying a plurality of data instructions for executing at least two consecutive operations of predetermined apparatus, wherein the data corresponding to an operation step of carrying out a successive multistage operation is set to be supplied in accordance with an input of a specific key, thereby consecutively outputting the instructions to execute the multistage operation in accordance with the specific key input.

To achieve the above object of the present invention, there is provided a data transmission method of a remote controller for controlling at least two apparatus equipped as a set. The method is carried out by setting a key for supplying a plurality of data outputs to the remote controller and consecutively producing the plurality of data when a user manipulates the key to allow the apparatus to successively carry out operations corresponding to the plurality of instructions.

Preferably, each of the plurality of data instructions has the same format but a different number of bits, or different formats with the same number of bits, or different formats and a different number of bits.

BRIEF DESCRIPTION OF THE DRAWINGS

The above objects and other advantages of the present invention will become more apparent by describing in detail preferred embodiments thereof with reference to the attached drawings in which:

FIG. 3 shows data supplied from the remote controller according to the present invention; and FIGS. 4A to 4E show the formats of the first and second data illustrated in FIG. 3.

DETAILED DESCRIPTION OF THE PREFERRED EMBODIMENT

Figure 1:
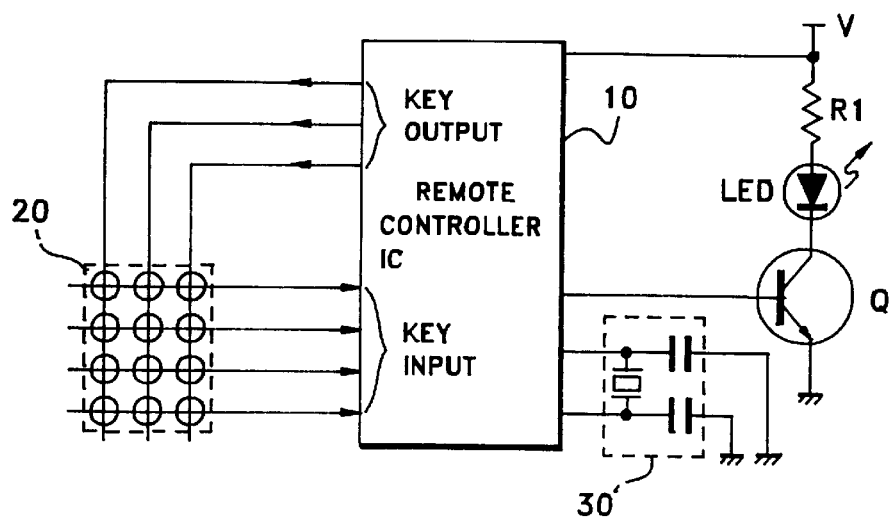
FIG. 1 is a circuit diagram showing a remote controller used for the present invention.

Referring to FIG. 1 showing a circuit diagram of a remote controller used for the present invention, a key matrix 20 capable of executing a key selection is connected to one side of a remote controller IC 10 for controlling the data transmission process of the remote controller. Another input of the remote controller IC 10 is connected to a crystal oscillator 30, which supplies clocks for the operation of the remote controller IC 10. A transistor Q for performing a switching operation in accordance with a signal from the remote controller IC 10, a light-emitting diode LED serially connected to the collector of the transistor Q, and a voltage supply resistor R1 are serially connected to the remote controller IC 10. The resistor R1, light-emitting diode LED, and the collector-base of the transistor Q form a closed loop together with the remote controller IC 10.

Figure 2:
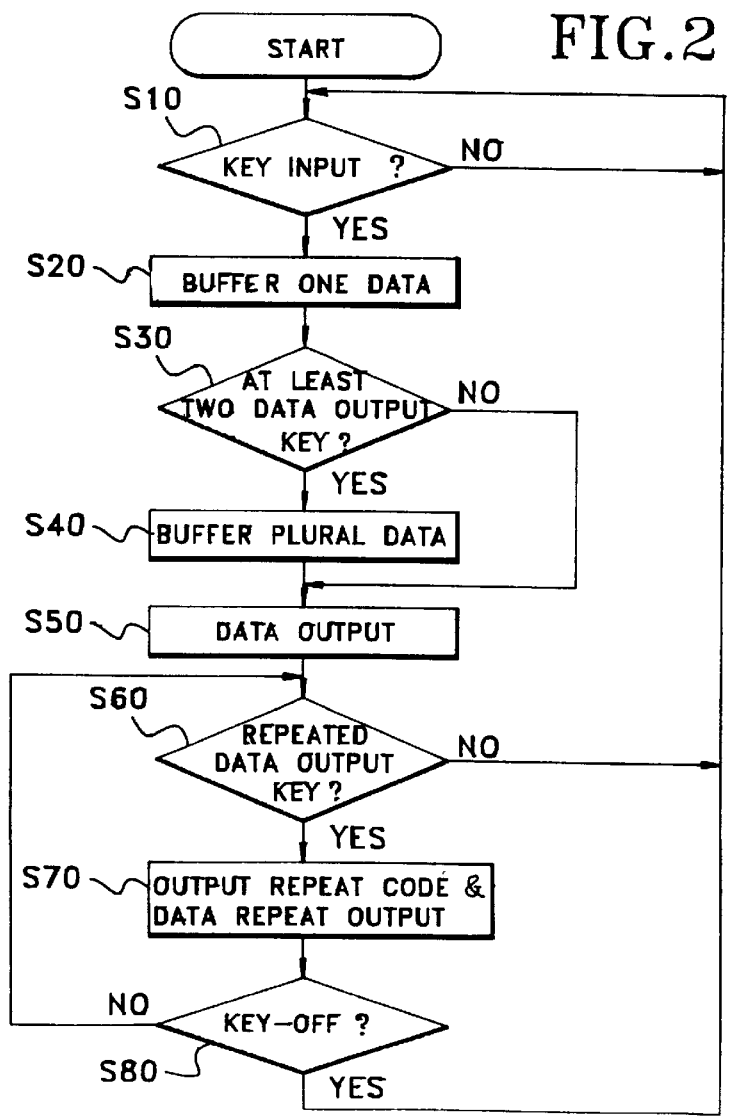
FIG. 2 is a flow chart showing one embodiment of a data transmission method of the remote controller according to the present invention.

FIG. 2 is a flow chart showing the data transmission method of the remote controller according to the present invention. In order to carry out the method, the key matrix 20 of FIG. 1 is provided with an optional key for externally supplying consecutive data. Also, in the remote controller IC 10, a feature that consecutively outputs data upon pressing a key for supplying a plurality of data is preset during manufacturing the remote controller IC 10. It will be understood that it is well within the skill of the art to program the IC 10 to respond to a given key input by outputing more than one data instruction.

At step S10, the remote controller IC 10 scans the keyboard to determine whether a key input caused by a user's key manipulation of the remote controller exists or not. At step S20, any corresponding data in accordance with a key input is entered into a buffer within the remote controller. After performing step S20, the remote controller IC 10 determines whether or not the key manipulated by the user is the key for supplying more than two data instructions to execute consecutive operations (step S30). If the manipulated key is the one for supplying at least two data instructions, the plurality of data instructions are stored in the buffer (step S40). When the key manipulated by the user is determined to be a key which does not supply at least two data instructions or following the buffering of the plurality of data instructions in S40, the remote controller IC 10 supplies the buffered data to the data output (step S50). Then, by determining whether or not the manipulated key in step S10 is a key for setting a repeated output to prevent an error during the data transmission (step S60), the remote controller IC 10 executes step S70 to supply a repeat code and repeatedly supplies the data when the key is for setting the repeated output, and then the key on/off state is checked in step S80. If it is determined that the key is not turned off, step S60 is performed again.

FIG. 3 shows the transmitted data from the remote controller according to the present invention. A header pulse is provided for setting an interrupt state, which functions by deciding the priority of processing the transmitted data and setting the interrupt state when an unshown microcomputer in the apparatus for receiving the data supplied from the remote controller goes to an interrupt state by the user's manipulation of the remote controller while the microcomputer is being operated. Moreover, composite data respectively formed of a custom code and a data code is disposed between respective header pulses. The custom code is for classifying products per manufacturing company, and the data code corresponds to the data for operating an actual receiver.

When the user manipulates a key, the remote controller IC 10 supplies first and second data in order, as shown in FIG. 3. At this time, the consecutive data of FIG. 3 corresponds to the first data which will be supplied in accordance with the power-on key input for turning on a VCR and the second data which will be supplied to the channel key input for selecting a television channel. FIGS. 4A to 4E show the formats of the first and second data illustrated in FIG. 3.

The data transmission method of the remote controller will be described with reference to FIGS. 1 to 4 for the case where a VCR and television are being controlled.

If the user intends to use the VCR and television equipped as one set, the user turns on the power of the VCR by means of the remote controller, and then selects a channel of the television. The data output process for these operations will be described for two cases: one in which the user manipulates keys which supply single data instructions only, and one in which the user manipulates a key for supplying a plurality of data instructions.

First, when the user manipulates the keys for supplying single data instructions, the remote controller IC 10 executes step S20 after determining that the key input exists in step S10 to buffer one output data instruction corresponding to the key signal received into the buffer within the remote controller IC 10. Since the key received by the user is a key for producing a single data instruction (S30), the single data instruction in the buffer (S20) is provided to the output (S50). At this time, the output of the data is carried out by switching of the transistor Q and performing the light-emitting operation of the light-emitting diode LED.

When the user manipulates the key for supplying a plurality of data instructions, the remote controller IC 10 executes step S20 after determining that the key input exists in step S10 to buffer one output data instruction corresponding to the key signal received into the buffer within the remote controller IC 10. In step S30, it is determined that the key is one which provides plural data instructions, and in step S40, the plurality of data instructions are entered into the buffer. Then, in step S50, the data is produced by the switching of the transistor Q and the light-emitting operation of the light-emitting diode LED.

After carrying out step S50, the remote controller IC 10 checks whether or not the key received in step S10 is a key for the repeat output of data. If so, a repeat code is generated in step S70 and the previous data instructions are repeatedly sent to the output. After step S70, the repeated output is continuously performed if the key remains in the on state. When it is determined that the key is in the off state in step S80, step S10 is carried out again.

The VCR and television controlled by the remote controller in accordance with the above-described process may be of the same or different manufacturing companies according to the user's intention. Therefore, the data for turning on the power of the VCR and the data for selecting the television channel may have the various formats as shown in FIGS. 4A to 4E.

Referring to FIGS. 4A to 4E, the data having the formats shown is supplied in accordance with the steps shown in FIG. 3. Here, if the key manipulated by the user is for supplying one data instruction, one data instruction corresponding to the manipulated key is produced. Similarly, if the key manipulated by the user is for supplying the plurality of data instructions, the consecutive plurality of data corresponding to the manipulated key are produced. Assuming that FIG. 4A show the data format for turning on the power of a VCR, the data format for selecting the television channel may be the same as those shown in FIG. 4B in view of the number of bits and format; otherwise, the arrangement of the custom code and data code are different but having the same number of bits as shown in FIG. 4C. Of course, as shown in FIG. 4D, the data format for the television-channel selection has the same format but different number of bits, while the number of bits and format are different, as shown in FIG. 4E.

Since the data format to be supplied from the remote controller can be easily adoptable by the designer in consideration of the apparatus to be controlled, various data formats of different cases as shown in FIGS. 4A to 4E may be supplied from the remote controller.

In the above-described embodiment, the turning on of a VCR and the channel selection of a television are given as examples, but the data transmission method of the remote controller according to the present invention can be used to carry out any desired consecutive operations which ordinarily would require key manipulation of the remote controller more than twice.

According to the data transmission method of the remote controller of the present invention as described above, a key on the remote controller is manipulated once to supply a plurality of data which execute the operations of a plurality of apparatus equipped as a set, so that at least two operations can be performed by the key manipulation once without requiring key manipulation more than twice to successively carry out at least two operations.

While the present invention has been particularly shown and described with reference to a particular embodiment thereof, it will be understood by those skilled in the art that various changes in form and details may be effected therein without departing from the spirit and scope of the invention as described by the appended claims.

What is claimed is:

1. A method for remotely controlling operations of at least two different apparatus from a remote controller having a keyboard with keys that are depressed to initiate data instructions that are transmitted to said apparatus, said method comprising:

actuating on said keyboard a key assigned for the control of at least two consecutive operations of said at least two different apparatus;

detecting the actuation of said key assigned for the control of at least two consecutive operations; and in response to said detection of said key, transmitting consecutively to said at least two apparatus at least two preset data instructions limited to product signal formats corresponding to said at least two apparatus, said data instructions being received by each of said at least two apparatus to control different operations in at least two of said apparatus, wherein some keys (single function keys) on said keyboard are preassigned to result in single data instructions being generated and transmitted by said remote controller and other keys (plural function keys) on said keyboard are preassigned to result in plural data instructions being generated and transmitted by said remote controller, and wherein the step of detecting the actuation comprises:

detecting whether or not any key on said keyboard is actuated;

in response to detection of actuation of a key in said last step, buffering a data instruction preassigned to the actuated key;

determining if the actuated key is a plural function key; and in response to determining that said activated key is a plural function key, buffering successive data instructions preassigned to said actuated plural function key so that said at least two preset data instructions are read from said buffer during the transmitting step.

2. The method of claim 1, wherein said at least two data instructions have the same format but different numbers of bits, respectively.

3. The method of claim 1, wherein said at least two data instructions have different formats but the same numbers of bits, respectively.

4. The method of claim 1, wherein said at least two data instructions have different formats and different numbers of bits, respectively.

* * * * *